United States Patent [19]

Wallbillich et al.

[11] Patent Number: 4,585,726

[45] Date of Patent: Apr. 29, 1986

[54] PHOTOPOLYMERIZABLE WATER-SOLUBLE OR WATER-DISPERSIBLE MIXTURE CONTAINING A SALT OF NITROUS ACID

[75] Inventors: Günter Wallbillich, Schifferstadt; Rudolf Vyvial, Ludwigshafen, both of Fed. Rep. of Germany

[73] Assignee: BASF Aktiengesellschaft, Fed. Rep. of Germany

[21] Appl. No.: 628,318

[22] Filed: Jul. 6, 1984

[30] Foreign Application Priority Data

Jul. 8, 1983 [DE] Fed. Rep. of Germany ....... 3324643

[51] Int. Cl.$^4$ .............................................. G03C 1/76
[52] U.S. Cl. ............................... 430/281; 204/159.15; 204/159.18; 430/917; 430/919; 526/83; 526/236; 522/83; 522/116
[58] Field of Search ............... 430/917, 919, 905, 281; 526/83, 236; 204/159.18, 159.15

[56] References Cited

U.S. PATENT DOCUMENTS

| 3,082,262 | 3/1963 | Scott | 526/83 |
| 3,418,300 | 12/1968 | Nakajima et al. | 526/236 |
| 4,239,849 | 12/1980 | Lipson et al. | 430/905 |
| 4,278,752 | 7/1981 | Gervey et al. | 430/281 |
| 4,340,686 | 7/1982 | Foss | 430/905 |
| 4,434,223 | 2/1984 | Kohira et al. | 430/905 |

FOREIGN PATENT DOCUMENTS

| 786119 | 11/1957 | United Kingdom . |
| 834337 | 5/1960 | United Kingdom . |
| 835849 | 5/1960 | United Kingdom . |
| 1233883 | 6/1971 | United Kingdom . |
| 1251475 | 10/1971 | United Kingdom . |
| 1416440 | 12/1975 | United Kingdom . |

Primary Examiner—Jack P. Brammer
Attorney, Agent, or Firm—Keil & Weinkauf

[57] ABSTRACT

Photopolymerizable water-soluble or water-dispersible mixtures essentially consist of a base polymer, at least one polymerizable ethylenically unsaturated compound, at least one photoinitiator and/or photosensitizer and at least one stabilizer, the thermal polymerization inhibitor being a water-soluble salt of nitrous acid.

5 Claims, No Drawings

PHOTOPOLYMERIZABLE WATER-SOLUBLE OR WATER-DISPERSIBLE MIXTURE CONTAINING A SALT OF NITROUS ACID

The present invention relates to photopolymerizable water-soluble or water-dispersible mixtures essentially consisting of a base polymer, one or more polymerizable ethylenically unsaturated compounds, one or more photoinitiators and/or photosensitizers and one or more stabilizers.

Photopolymerizable mixtures of the stated type become insoluble when exposed to light, and it is known that they can be used for the production of printing plates, coating materials and photosensitive finishes, and in general for the fixing, reproduction and transfer of information. However, these mixtures have to be stabilized against premature spontaneous thermal polymerization, which can occur during storage or transport. A conventional method comprises the addition of free radical acceptors, antioxidants, peroxide-decomposing substances, hydrogen acceptors and donors, electron acceptors and donors and/or complex formers. Gases too, eg. oxygen and the oxides of nitrogen, can play an important role in suppressing the spontaneous polymerization of photopolymerizable mixtures. A large number of specific compounds have been described as being suitable, eg. phenolic compounds, hydroquinone and its derivatives, amines, nitrosamines, nitro and nitroso compounds, hydroxylamines, N-nitrosohydroxylamine derivatives, hydrazines, urea and its derivatives, thiourea and its derivatives, dithiocarbamates, pyridines, quinolines, N-containing heterocyclic compounds, sulfur, ascorbic acid, tocopherol, methylene blue, phosphines, phosphites and complex formers, such as polyphosphoric and polysilicic acids and their salts, nitrilotriacetic acid, EDT and hydroxycarboxylic acids. Furthermore, combinations of two or more compounds of the stated type have been disclosed, generally because of a synergistic effect. However, these thermal polymerization inhibitors frequently have the disadvantage that they reduce the photosensitivity even though they are completely effective in improving the stability of the photosensitive materials. In choosing the stabilizers, their color should also be taken into account, since the occurrence of discoloration during storage and in the reactions presents problems in connection with the use of the photopolymerizable mixtures. This is particularly important since most stabilizers and/or their secondary products often absorb in the wavelength range from 300 to 500 nm, which is important for the photopolymerization.

Particularly with regard to the use of photopolymerizable mixtures for the storage, reproduction and transfer of information, the stated disadvantages or limitations of the conventional stabilizers have to be taken into account very carefully. For example, high photosensitivity has recently become a very much greater requirement in the abovementioned field of use. However, the use of the conventional thermal polymerization inhibitors does not result in photopolymerizable mixtures which on the one hand possess high photosensitivity and on the other hand do not give rise to difficulties when used in practice. The mixtures which have a complex composition and possess the desired high photosensitivity are just the ones where there is a large number of possible ways in which premature polymerization can be initiated. The high photosensitivity also necessitates the metering of a very small amount of the stabilizers, the choice of which furthermore is greatly restricted by the requirement for transparency in the wavelength range in which the photopolymerization is initiated.

On the other hand, the tendency, arising out of environmental reasons, to produce photopolymerizable mixtures free of organic solvents, or very greatly to reduce the amount of organic solvents, necessitates the development of substantially novel photopolymerizable systems, for which the conventional stabilizers are in general very inadequate. This applies in particular because the photopolymerizable mixtures suitable for information processing have to meet very high requirements in respect of sensitivity and resolution, ie. high reproduction density.

It is an object of the present invention to provide photopolymerizable mixtures which, for a given water-solubility or water-dispersibility, possess high photosensitivity and high resolution, ie. excellent optical properties, and contain a thermal polymerization inhibitor which avoids the above disadvantages.

We have found, surprisingly, that this object is achieved by a photopolymerizable mixture in accordance with the preamble of the principal claim, if the said mixture contains, as a thermal polymerization inhibitor, from 0.001 to 1, particularly advantageously from 0.1 to 0.2, % by weight, based on the amount of anhydrous photopolymerizable mixture, of a water-soluble salt of nitrous acid.

For the purposes of the present invention, very particularly suitable stabilizers among the water-soluble salts of nitrous acid are potassium nitrite and sodium nitrite.

The composition of the photopolymerizable water-soluble or water-dispersible mixtures is known er se. Examples of suitable photosensitive layers of one or more hydrophilic binders with one or more compatible photopolymerizable ethylenically unsaturated monomers and one or more photoinitiators are mixtures as described in, inter alia, British Pat. Nos. 786,119, 834,337, 835,849, 1,233,883, 1,251,475 and 1,416,440.

Vinyl alcohol polymers containing —CH$_2$CH(OH) structural units in the polymer main chain, and their water-soluble or water-dispersible copolymers and derivatives, eg. esters, ethers or acetals, have proven particularly useful base polymers. Particularly suitable compounds are the conventional hydrolyzed polyvinyl esters of aliphatic monocarboxylic acids of 1 to 4 carbon atoms, eg. polyvinyl acetates or polyvinyl propionates, which have a mean degree of polymerization of from 200 to 3,000, in particular from 250 to 750, and a degree of hydrolysis of from 65 to about 100, in particular from 80 to 88, mole %. Mixtures of hydrolyzed vinyl ester polymers or copolymers having different degrees of polymerization and/or different degrees of hydrolysis can also be used. Other suitable compounds in this connection are the reaction products of vinyl alcohol polymers with acrylic and/or methacrylic anhydride, these products containing in general from 3 to 30% by weight, based on the reaction product, of acryloyl or methacryloyl groups, as well as the water-soluble reaction products of vinyl alcohol polymers with ethylene oxide, or products obtained by grafting vinyl alcohol (derivatives) onto polyethylene oxide, where the amount of ethylene oxide units in the oxyethylated vinyl alcohol polymer is from 5 to 75, in particular from 10 to 60, % by weight. These reaction products of vinyl alcohol polymers can be present in the mixtures either as the sole polymer component or as a mixture with other vinyl alcohol polymers, in particular the stated hydrolyzed polyvinyl esters, in which case the amount of the reaction products of the polyvinyl alcohol is advantageously not less than 30% by weight, based on the total amount of vinyl alcohol polymers present in the mixture. Moreover, the stated vinyl alcohol polymers or copolymers and/or their derivatives can be mixed with not more than about 30% by weight, based on the amount of polymer in the particular photopolymerizable material, of compatible melamine/formaldehyde, urea/formaldehyde or phenol/formaldehyde resins.

The conventional cellulose derivatives, gelatin, alginates and polyvinylpyrrolidones, when used as the base polymer, also meet the requirements set.

Suitable photopolymerizable ethylenically unsaturated monomers for the mixture include the conventional monomers which have a molecular weight of less than 2,000 and are known per se in connection with photopolymerizable materials containing polymeric binders. Of course, the type and amount of the photopolymerizable monomers depend on the polymeric binder used concomitantly, and the stated monomers should be compatible with this binder. Low molecular weight photopolymerizable compounds possessing two or more ethylenically unsaturated photopolymerizable double bonds are very useful either alone or as a mixture with monomers containing only one olefinically unsaturated photopolymerizable double bond. The amount of monomers containing only one double bond depends on the polymer binders present. With certain preconditions, it is of course possible for the photopolymerizable monomers used to be predominantly those which contain only one photopolymerizable double bond in the molecule, particularly when the polymer binder present itself contains a high proportion of photocrosslinkable double bonds, this being the case, for example, when the vinyl alcohol polymers possessing acryloyl and/or methacryloyl groups are used. In general, the photopolymerizable monomers have a boiling point above 100° C. under atmospheric pressure.

Examples of low molecular weight photopolymerizable unsaturated compounds are mono-, di- and polyacrylates and -methacrylates, as can be prepared by esterification of acrylic acid or methacrylic acid with low molecular weight monohydric or polyhydric alcohols. Such compounds include the di- and tri(meth)acrylates of ethylene glycol, diethylene glycol, triethylene glycol, polyethylene glycol having a molecular weight as high as about 500, propane-1,2-diol, propane-1,3-diol, polypropylene glycols having a molecular weight as high as about 500, neopentylglycol (2,2-dimethylpropanediol), butane-1,4-diol, 1,1,1-trimethylolpropane, glycerol and pentaerythritol, as well as the monoacrylates and monomethacrylates of such diols or polyols, eg. ethylene glycol monoacrylate and monomethacrylate, propane-1,2-diol monoacrylate and monomethacrylate, propane-1,3-diol monoacrylate and monomethacrylate, and di-, tri- and tetraethylene glycol monoacrylate andd monomethacrylate. Other suitable compounds are those which contain urethane and/or amide groups, such as the low molecular weight compounds prepared from aliphatic diols of the above type, organic diisocyanates, eg. hexamethylene diisocyanate, toluylene diisocyanate and isophorone diisocyanate, and hydroxyalkyl acrylates or methacrylates of the above type. Other examples are acrylic acid, methacrylic acid, acrylates and methacrylates of alkanols of 1 to 6 carbon atoms, mono- and bisacrylamides and -methacrylamides of aliphatic or aromatic diamines of 2 to 8 carbon atoms, for example those of ethylenediamine, propylenediamine, butylenediamine, pentamethylenediamine, hexamethylenediamine, octamethylenediamine or xylylenediamine, as well as derivatives of acrylamide or methacrylamide, eg. hydroxymethylacrylamide or -methacrylamide, and in particular the reaction products of 2 moles of N-hydroxymethyl acrylamide or methacrylamide with one mole of an aliphatic diol, eg. ethylene glycol or propylene glycol.

The range of suitable monomers depends on the polymer binders present and on the desired properties of the end product, and is familiar to the skilled worker. If vinyl alcohol polymers are used as polymer binders, particularly suitable monomers are the water-soluble monomers, eg. the hydroxyalkyl acrylates or methacrylates, the mono- or diacrylates or mono- or dimethacrylates of polyethylene glycols or mixtures of these with di- or polyacrylates or di- or polymethacrylates of the stated type.

The photopolymerizable mixtures contain in general about 50–90% by weight of the polymers and from 10 to 50% by weight of the photopolymerizable ethylenically unsaturated monomers, the percentages being based on the sum of polymers and monomers in each case. In particular cases, the amount of monomers can be larger or smaller. For example, it is possible to reduce the amount of monomers to below 10% by weight when the mixture contains unsaturated polymers having a sufficiently high content of photocrosslinkable double bonds.

The photopolymerization initiators are present in the mixtures in general in amounts of from 0.05 to 10, in particular from 0.5 to 5, % by weight, based on the mixture, and suitable initiators are the conventional photopolymerization initiators and systems for initiating photopolymerization during exposure to actinic light, as adequately described in the relevant specialist literature. Examples of suitable initiators are acyloins and their derivatives, such as benzoin alkyl ethers, eg. benzoin methyl ether or benzoin isopropyl ether, α-methylolbenzoin and its ethers or α-methylbenzoin and its ethers; 1,2-diketones and their derivatives, such as diacetyl, benzil, benzil ketals, eg. benzil dimethyl ketal, benzil methyl ethyl ketal, benzil methyl benzyl ketal or benzil ethylene glycol monoketal; acylphosphine oxide compounds, in particular acyldiarylphosphine oxides and especially acyldiphenylphosphine oxides whose acyl radical is derived from a tertiary aliphatic or cycloaliphatic carboxylic acid or from a benzoic acid which is substituted at least in the 2,6-position, as described in detail in German Laid-Open Application DOS 2,909,992. The photopolymerization initiators can be used alone or as a mixture with one another or with activators, eg. tertiary amines.

In connection with the working up of the novel mixtures, it has proven advantageous for some applications if, in addition to the water-soluble salts of nitrous acid, further substances are added.

These include, in particular, thermal polymerization inhibitors, eg. hydroquinone, p-methoxyphenol, m-dinitrobenzene, p-quinone, methylene blue, β-naphthol, N-nitrosamines, such as N-nitrosodiphenylamine or the salts, in particular the alkali metal and aluminum salts, of N-nitrosocyclohexylhydroxylamine. These inhibitors are used in general in amounts of from 0.01 to 2.0% by weight, based on the material of the mixture, in addition to the salts of nitrous acid, and the total amount should not exceed 3% by weight.

The photopolymerizable mixtures can also contain, as further additives, plasticizers, dyes, pigments or the like.

The photosensitive recording materials are exposed to light sources which are capable of emitting actinic light in the wavelength range of in general from 250 to 500 nm, preferably from 300 to 450 nm, and whose emission maxima are in general in the region of the absorption of the photoinitiators.

In addition to possessing increased sensitivity and providing high resolution in information processing, the photopolymerizable mixtures according to the invention have the advantage of not requiring any organic solvents which pollute the environment. In particular, however, these mixtures according to the invention possess substantially increased stability at room temperature and at elevated temperatures as high as 100° C. The time during which the mixture is stable to spontaneous thermal polymerization or other types of spontaneous polymerization is prolonged in many cases by a factor of from 2 to 10. The handling of some highly sensitive mixtures in industry has only become possible at all as a result of the stabilization according to the invention.

The Examples and Comparative Experiments which follow illustrates the invention. Parts are by weight, unless stated otherwise.

EXAMPLE 1

67.5 parts of a polyvinylpyrrolidone having a molecular weight of from 600,000 to 80,000 (K value 92) are dissolved in 400 parts of fully demineralized water at 90° C., the solution is cooled to 70° C., and 30 parts of a diether obtained from 1 mole of ethylene glycol and 2 moles of N-hydroxymethylacrylamide, 0.1 part of N-nitrosocyclohexylhydroxylamine, 0.01 part of sodium nitrite and 2.5 parts of α-methylolbenzoin methyl ether are then added. As soon as all of the components have dissolved, the solution is filtered, and devolatilized under reduced pressure. By means of a suitable shaping method, photosensitive elements are produced from the resulting solution.

A sample subjected to a stability test in a closed ampoule at 80° C. in the absence of actinic radiation remains unchanged for 46 hours, whereas a solution prepared without the use of sodium nitrite solidifies after only 6 hours. The stability factor is thus 7.7.

EXAMPLE 2

145 parts of a polyvinylpyrrolidone having a molecular weight of from 600,000 to 800,000 (K value 92) and 135 parts of a partially hydrolyzed polyvinyl acetate containing 22% of bonded polyoxyethylene segments (mean molecular weight from 25,000 to 30,000) are dissolved in a solution of 1.5 parts of sodium nitrite in 450 parts of fully demineralized water at 90° C. A solution of 12.5 parts of benzil dimethyl ketal, 0.1 part of N-nitrosodiphenylamine and 0.025 part of eosin in a mixture of 110 parts of β-hydroxyethyl methacrylate and 88 parts of 1,1,1-trimethylolpropane trimethacrylate is then added slowly to the aqueous solution at 70° C., and the resulting mixture is filtered, and devolatilized under reduced pressure. The viscous solution obtained is used for the production of photosensitive elements.

The stability factor determined in the stability test described above is 5.6.

EXAMPLE 3

68 parts of an N-vinylpyrrolidone/vinyl acetate copolymer (weight ratio 60:40) having a K value of 32, and 0.05 part of sodium nitrite, are dissolved in 67 parts of fully demineralized water at 70° C., after which a solution of 5 parts of 1,1,1-trimethylolpropane triacrylate 2.0 parts of benzil dimethyl ketal and 0.1 part of N-nitrosocyclohexylhydroxylamine in 25 parts of β-hydroxyethyl methacrylate is stirred in. The solution is filtered, and devolatilized under reduced pressure. By means of a suitable shaping method, photosensitive elements are produced from the resulting solution.

In the stability test at 80° C. in a closed ampoule, polymer particles begin to separate out from the solution after 36 hours. In a comparative batch prepared without sodium nitrite, polymer was observed after as short a time as 11 hours. The stability factor is thus 3.3.

EXAMPLE 4

174 parts of an N-vinylpyrrolidone/vinyl acetate copolymer (weight ratio 60:40) having a K value of 32, and 75 parts of a partially hydrolyzed polyvinyl acetate containing 22% of bonded polyoxyethylene segments and having a mean molecular weight of from 25,000 to 30,000, are dissolved in 210 parts of fully demineralized water at 80° C., after which a solution of 0.4 part of sodium nitrite in 10 parts of water is added. Finally, a solution of 6.0 parts of α-methylolbenzoin methyl ether, 0.3 part of N-nitrosodiphenylamine and 0.015 part of eosin in 45 parts of 1,1,1-trimethylolpropane triacrylate is stirred in, and the mixture is filtered, and devolatilized under reduced pressure. Photosensitive elements are produced from the resulting solution. The stability factor is 4.1.

EXAMPLE 5

432 parts of a partially hydrolyzed polyvinyl acetate having a degree of hydrolysis of 88 mole % and a mean degree of polymerization of 500 are dissolved in 610 parts of fully demineralized water at 90° C., after which 0.08 part of sodium nitrite, dissolved in 16 parts of water, and a solution of 29 parts of a diether, obtained from 1 mole of ethylene glycol and 2 moles of N-hydroxymethylacrylamide, and of 11 parts of α-methylolbenzoin methyl ether in 300 parts of β-hydroxyethyl methacrylate are added. The homogeneous solution is filtered and then devolatilized under reduced pressure. Photosensitive elements are produced from the resulting solution.

In the stability test at 80° C. in a closed ampoule, polymer formation is found to begin after 35 hours. A comparative batch produced without sodium nitrite polymerizes after 2 hours. The stability factor is thus 17.5.

EXAMPLE 6

The experiment described in Example 5 is repeated using 0.8 part (instead of 0.08 part) of sodium nitrite. In this case, the ready-prepared solution has a slight yellow coloration. The exposure properties of the photopolymerizable elements produced from this solution are essentially unchanged. The solution remains stable for 52 hours at 80° C. The stability factor is 26.

EXAMPLE 7

495 parts of a partially hydrolyzed polyvinyl acetate having a degree of hydrolysis of 82 mole % and a mean degree of polymerization of from 500 to 600 are dissolved in 520 parts of fully demineralized water at 90° C., while stirring. 0.2 part of sodium nitrite in 10 parts of water are added, after which a solution of 19 parts of tetraethylene glycol dimethacrylate, 15 parts of α-methylolbenzoin methyl ether, 1.5 parts of 2,6-di-tert.-butyl-p-cresol and 0.05 part of eosin in 405 parts of β-hydroxyethyl methacrylate is stirred in. The solution is filtered and devolatilized, and then used to produce photosensitive elements.

In the stability test, the solution is stable for 38 hours, while a comparative mixture without sodium nitrite polymerizes after 3 hours. The stability factor is thus 12.7.

EXAMPLE 8

1,036 parts of a partially hydrolyzed polyvinyl acetate having a degree of hydrolysis of 82 mole % and a mean degree of polymerization of from 500 to 600 are dissolved in 1,050 parts of fully demineralized water at 90° C., while stirring. 0.10 parts of sodium nitrite is added in the form of a 5% strength aqueous solution, after which a solution of 37 parts of tetraethylene glycol dimethacrylate, 29 parts of benzil dimethyl ketal, 2.9 parts of 2,6-di-tert.-butyl-p-cresol and 0.10 part of eosin in 880 parts of β-hydroxyethyl methacrylate is stirred in. The homogeneous solution is filtered, devolatilized and then processed to give photosensitive elements.

In the test at 80° C., the ready-prepared solution is stable for 68 hours. Comparison with the nitrite-free formulation gives a stability factor of 13.6.

EXAMPLE 9

Example 8 is modified by using twice the amount of sodium nitrite. The solution remains stable for 86 hours. The stability factor is 17.2.

EXAMPLE 10

378 parts of a partially hydrolyzed polyvinyl acetate having a degree of hydrolysis of 82 mole % and a mean degree of polymerization of from 500 to 600 are dissolved in 450 parts of fully demineralized water at 90° C. by stirring for several hours. The solution is cooled to 70° C., after which 162 parts of a partially hydrolyzed polyvinyl acetate having a degree of hydrolysis of 80 mole %, containing 22% of bonded polyoxyethylene segments and having a mean molecular weight of from 25,000 to 30,000 are added, stirring being continued. First 0.2 part of sodium nitrite, dissolved in 10 parts of water, and then a solution of 80 parts of butane-1,4-diol dimethacrylate, 15 parts of benzil dimethyl ketal, 1.5 parts of 2,6-ditert.-butyl-cresol, 0.2 part of N-nitrosodiphenylamine and 0.03 part of eosin in 360 parts of β-hydroxyethyl methacrylate are stirred in. The solution is filtered and devolatilized, after which it is used to produce photosensitive elements. In the stability test at 80° C., the first visible signs of polymerization appear after 62 hours. In contrast, the nitrite-free comparative mixture remains stable for only 15 hours. The stability factor is 4.1.

EXAMPLE 11

222 parts of a partially hydrolyzed polyvinyl acetate having a degree of hydrolysis of 83 mole % and a mean degree of polymerization of 600 are dissolved in 318 parts of fully demineralized water at 90° C. The mixture is cooled to 70° C., after which 95 parts of a partially hydrolyzed polyvinyl acetate containing 22% of bonded polyethylene glycol segments and having a mean molecular weight of from 25,000 to 30,000 are stirred in, and 0.13 part of sodium nitrite, dissolved in 5 parts of water, is then added. A solution of 48 parts of butane-1,4-diol dimethacrylate, 3.8 parts of 2,4,5-trimethylbenzoyldiphenylphosphine oxide, 1.0 part of 2,6-di-tert.-butyl-p-cresol, 0.13 part of N-nitrosodiphenylamine, 0.13 part of 85% strength phosphoric acid, 0.07 part of hydroquinone, 0.07 part of hydroquinone monomethyl ether and 0.032 part of eosin in 281 parts of β-hydroxyethyl methacrylate is then added and the mixture is processed to a homogeneous solution, which is used to produce photosensitive elements.

In the stability test at 80° C. in a closed ampoule, polymer is formed after 24 hours. The comparative mixture without sodium nitrite remains unchanged for only 13 hours. The stability factor is thus 1.8.

EXAMPLE 12

343 parts of a partially hydrolyzed polyvinyl acetate having a degree of hydrolysis of 83 mole % and a mean degree of polymerization of 600 are dissolved in 520 parts of fully demineralized water at 90° C. The solution is cooled to 70° C., after which 177 parts of a partially hydrolyzed polyvinyl acetate containing 22% of bonded polyethylene oxide segments and having a mean molecular weight of from 25,000 to 30,000 are stirred in. A solution of 74 parts of butane-1,4-diol dimethacrylate, 9 parts of 2,4,6-trimethylbenzoyldiphenylphosphine oxide, 1.5 parts of 2,6-di-tert.-butyl-p-cresol and 0.2 part of N-nitrosodiphenylamine in 416 parts of β-hydroxyethyl methacrylate is then added, and the homogeneous solution is filtered and devolatilized. To increase the thermal stability, portions of this solution are also mixed with sodium nitrite, and their tendency to undergo spontaneous polymerization at 80° C. is then tested in the conventional manner (cf. Table).

| Amount added | Stability in the stability test | Stability factor |
|---|---|---|
| 0 | 9 | = 1 |
| 0.01% of NaN02 | 17 | 1.8 |
| 0.02% of NaN02 | 31 | 3.4 |
| 0.05% of NaN02 | 40 | 4.4 |

We claim:

1. A photopolymerizable water-soluble or water-dispersible mixture which consists essentially of a polymer, at least one low molecular weight photopolymerizable unsaturated compound containing one or more acrylyl or methacrylyl groups, at least one compound selected from the group consisting of photoinitiators and photosensitizers, and as a thermal polymerization inhibitor, from 0.001 to 1% by weight, based on the amount of anhydrous photopolymerizable mixture, of a water-soluble salt of nitrous acid.

2. A photopolymerizable water-soluble or water-dispersible mixture as defined in claim 1, which contains from 0.01 to 0.2% by weight of a water-soluble salt of nitrous acid.

3. A photopolymerizable water-soluble or water-dispersible mixture as defined in claim 1, which contains, as a stabilizer, in addition to a water-soluble salt of nitrous acid, one or more compounds selected from the group consisting of hydroquinone, its derivatives, phenol compounds and N-nitroso compounds.

4. A photopolymerizable water-soluble or water dispersible mixture as defined in claim 1 wherein the water-soluble salt of nitrous acid is sodium nitrite or potassium nitrite.

5. A photopolymerizable water-soluble or water-dispersible mixture as defined in claim 1 wherein the low molecular weight photopolymerizable compound is β-hydroxyethyl methacrylate.

* * * * *